US012782436B2

(12) United States Patent
Peng et al.

(10) Patent No.: US 12,782,436 B2
(45) Date of Patent: Nov. 3, 2026

(54) TECHNIQUES FOR CAPTURING SIGNALS FROM LOGIC CIRCUITS AT A LOGIC ANALYZER

(71) Applicant: Intel Corporation, Santa Clara, CA (US)

(72) Inventors: Yi Peng, Newark, CA (US); Nishant Bhargava, Portland, OR (US); Velayutham Durairaj, Austin, TX (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 18/122,238

(22) Filed: Mar. 16, 2023

(65) Prior Publication Data

US 2023/0213581 A1 Jul. 6, 2023

(51) Int. Cl.
*G01R 31/3177* (2006.01)
*G06F 30/343* (2020.01)

(52) U.S. Cl.
CPC ....... *G01R 31/3177* (2013.01); *G06F 30/343* (2020.01)

(58) Field of Classification Search
None
See application file for complete search history.

(56) References Cited

U.S. PATENT DOCUMENTS 5,960,191 A * 9/1999 Sample ................. G06F 30/331 703/23
6,182,247 B1 1/2001 Herrmann et al.
6,286,114 B1 * 9/2001 Veenstra ................. G06F 11/27 714/E11.169
7,536,615 B1 * 5/2009 Pierce ................ G01R 31/3177 714/39
9,494,967 B2 11/2016 Hutchings et al.
9,495,492 B1 * 11/2016 Ramabadran ......... G06F 30/331
10,062,454 B1 * 8/2018 Merugu .................... G06F 1/10
2002/0194543 A1 12/2002 Veenstra et al.
(Continued)

OTHER PUBLICATIONS

C. Zet and C. Fosalau, "FPGA Based Logic Analyzer," 2018 International Conference and Exposition on Electrical and Power Engineering (EPE), Iasi, Romania, 2018, pp. 0335-0340, (Year: 2018).*
(Continued)

*Primary Examiner* — Daniel F. McMahon
(74) *Attorney, Agent, or Firm* — InventIQ Legal LLP; Steven J. Cahill

(57) ABSTRACT

An integrated circuit includes logic circuits, a logic analyzer circuit, and a multiplexer circuit configurable to provide a value of a signal selected from one of the logic circuits to the logic analyzer circuit. The logic analyzer circuit is configured to store the value of the signal selected by the multiplexer circuit. A method is provided for capturing signals within an integrated circuit. The method includes providing a first logic signal from a first logic circuit to a multiplexer circuit, providing a second logic signal from a second logic circuit to the multiplexer circuit, selecting one of the first logic signal or the second logic signal as a selected signal using the multiplexer circuit, and storing a value of the selected signal in the logic analyzer circuit in the integrated circuit.

20 Claims, 6 Drawing Sheets

(56) References Cited

U.S. PATENT DOCUMENTS

| | | | | |
|---|---|---|---|---|
| 2006/0190758 | A1 | 8/2006 | Wickeraad | |
| 2011/0047427 | A1 | 2/2011 | Bailey et al. | |
| 2011/0167311 | A1* | 7/2011 | Bailey | G01R 31/3177<br>714/E11.155 |
| 2015/0214933 | A1 | 7/2015 | Sehgal et al. | |
| 2015/0278418 | A1* | 10/2015 | Kodavalla | G06F 30/34<br>716/117 |
| 2017/0045582 | A1 | 2/2017 | Ko | |
| 2022/0077856 | A1* | 3/2022 | Peng | H03K 19/177 |

OTHER PUBLICATIONS

Korean Intellectual Property Office, "Written Opinion of the International Searching Authority," International application No. PCT/US2023/082609, Apr. 11, 2024, pp. 1-7.

* cited by examiner

TECHNIQUES FOR CAPTURING SIGNALS FROM LOGIC CIRCUITS AT A LOGIC ANALYZER

TECHNICAL FIELD

The present disclosure relates to electronic integrated circuits, and more particularly, to circuits and methods for capturing signals from logic circuits in an integrated circuit at a logic analyzer circuit.

BACKGROUND ART

In the field of electronics, various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits, and configurations for programmable integrated circuits. Programmable integrated circuits can be programmable by a customer to produce a custom circuit design for the integrated circuit. After a programmable integrated circuit (IC) has been programmed with a custom circuit design and is operating within a working system, it is important to be able to debug the IC, for example, by capturing the values of signal traces within the custom circuit design.

DETAILED DESCRIPTION

Figure 1:
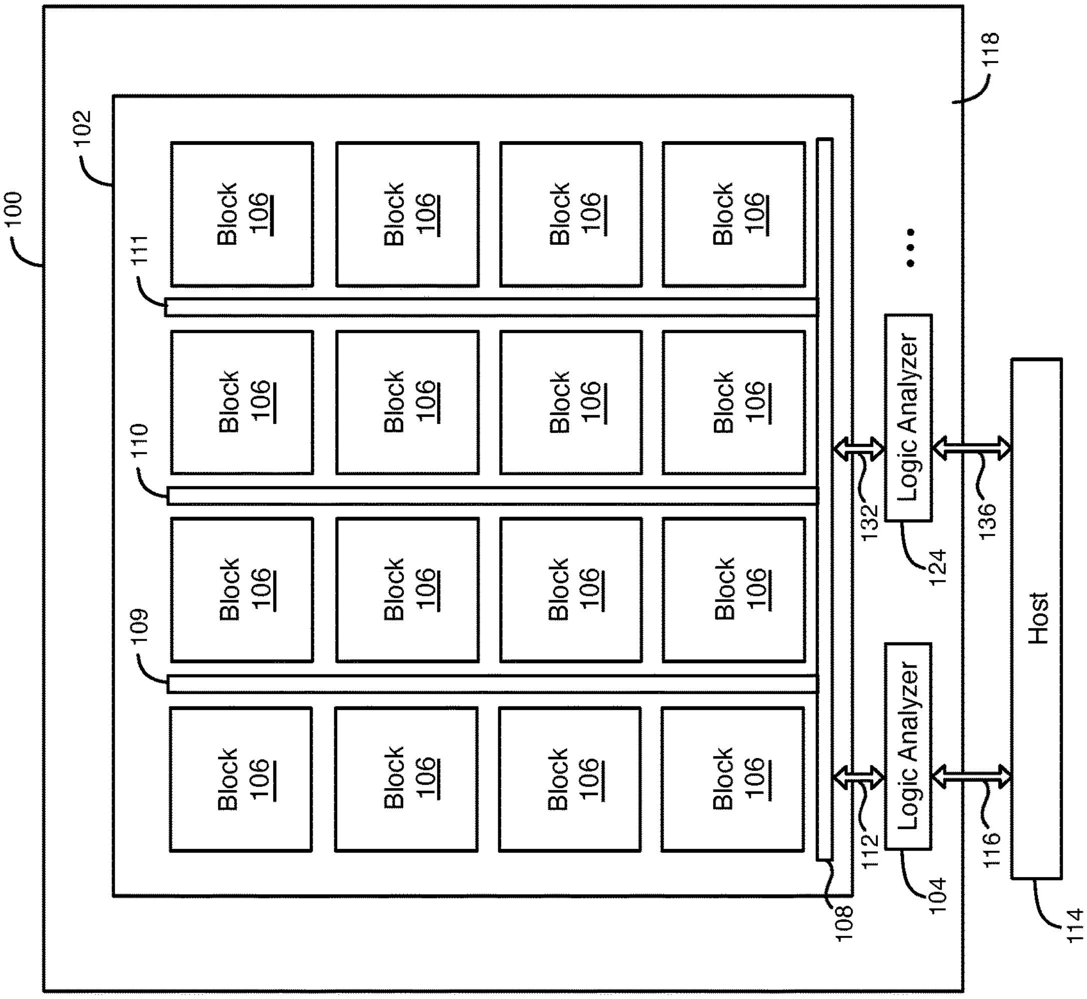
FIG. 1 is a diagram that illustrates an example of an integrated circuit that includes logic analyzer circuits.

This disclosure discusses integrated circuit devices, including programmable (configurable) integrated circuits, such as field programmable gate arrays (FPGAs). As discussed herein, an integrated circuit (IC) can include hard logic and/or soft logic. As used herein, "hard logic" generally refers to circuits in an integrated circuit device that are not programmable by an end user. The circuits in an integrated circuit device (e.g., in a programmable IC) that are programmable by the end user are referred to as "soft logic."

In typical custom circuit designs for programmable integrated circuits, users aim to have high value custom circuit designs that invariably have a very high utilization cost. Challenges arise when a circuit design (also referred to herein as a custom circuit design) for a programmable integrated circuit needs to be debugged. Adding debug functionality to a circuit design often requires the utilization of soft logic resources in the programmable integrated circuit. Often, a user must either migrate a circuit design to a larger programmable integrated circuit to provide enough soft logic for the debug functionality or make design compromises by trading off functionality of the circuit design for the debug functionality. Re-fitting, re-timing, and recompiling a debug-enabled circuit design adds to the time-to-market of the circuit design. Another problem that occurs frequently when adding debug functionality to a circuit design for a programmable integrated circuit is that a change in the overall system behavior of the circuit design caused by adding the debug functionality may make any errors in the circuit design disappear. Another significant limitation for users that attempt to debug circuit designs for programmable integrated circuits (ICs) has been the high throughput needed to capture signal traces within the circuit designs (e.g., tens of gigabits per second).

An integrated circuit (IC) can include an embedded logic analyzer circuit that uses embedded memory in the IC running at the same frequency as signals being monitored in the IC to provide matching bandwidth that guarantees the signals can be captured. If the embedded memory provides very limited storage capability, a user may have to make a trade-off between the number of captured signals and the number of samples of the signals captured. This trade-off results in users either capturing the needed signals, but without the needed time period of IC operation to fully understand the problem, or capturing a sufficient time period of IC operation, but without the full complement of signals needed to understand what logic circuits misbehaved in the circuit design.

Embedded logic analyzer circuits are typically implemented using soft logic resources in programmable ICs. The soft logic resources used for embedded logic analyzer circuits cannot be used for a custom circuit design for the programmable IC. Also, introducing an embedded logic analyzer circuit into a circuit design using soft logic requires extensive place and route changes to the circuit design that often fail to preserve signal timing. These changes in signal timing can change a failure scenario or sequence in the circuit design that a user is trying to debug. Routing internal signals to output pads of the programmable IC consumes additional valuable device resources, which may limit the number of internal signals that can be analyzed concurrently.

According to some examples disclosed herein, a highly optimized embedded logic analyzer circuit is provided in hard logic in a programmable integrated circuit (IC) for debugging a circuit design for the programmable IC. The programmable IC can also include a hardware interface coupled between the embedded logic analyzer circuit and the soft logic that implements the circuit design debugged by the embedded logic analyzer circuit. The hardware interface can be controlled by software that is made available to a user. The hardware interface can expose a signal input interface of the embedded logic analyzer circuit to the soft logic that implements the circuit design for the programmable IC. Signals generated by the circuit design in various stages of compilation can be routed to the signal input interface of the embedded logic analyzer circuit through the hardware interface. The signals generated by the circuit design can, for example, be routed to the embedded logic analyzer circuit through multiplexer circuits implemented in hard logic or in soft logic and that are part of the hardware interface. The hardware interface allows a user to select signals to be provided to the embedded logic analyzer circuit with one compilation effort and fast run-time switching.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure (FIG. 1 is a diagram that illustrates an example of an integrated circuit 100 that includes logic analyzer circuits. Integrated circuit (IC) 100 can be any type of integrated circuit (IC), such as a programmable integrated circuit (IC), a microprocessor or central processing unit (CPU), a graphics processing unit (GPU), an application specific IC, a memory IC, etc. Programmable ICs include any integrated circuits that can be programmed to perform a custom circuit design, including programmable logic arrays (PLAs), programmable array logic (PAL), field programmable gate arrays (FPGAs), and programmable logic devices (PLDs).

Integrated circuit (IC) 100 includes a core logic region 102 and a peripheral region 118. The peripheral region 118 includes logic analyzer circuits 104 and 124. IC 100 can also include additional logic analyzer circuits. The core logic region 102 includes 16 blocks 106 of logic circuits, bi-directional horizontal routing channel 108, and bi-directional vertical routing channels 109-111. Although 16 blocks 106 and 4 routing channels 108-111 are shown in FIG. 1, it should be understood that IC 100 and other ICs having logic analyzer circuits can have any number of blocks of logic circuits and any number of routing channels. Each of the routing channels can include conductors (wires), buffer circuits, and/or multiplexer circuits for routing signals. IC 100 also includes routing channels in blocks 106 in addition to routing channels outside blocks 106. As examples, blocks 106 can include programmable logic circuits, digital signal processing (DSP) circuits, memory circuits (e.g., static random access memory or SRAM), microprocessors, etc. Programmable logic circuits in one or more of blocks 106 can include, for example, adaptive logic modules, lookup tables, registers, programmable logic array blocks, etc. The routing channels 108-111 can include, for example, programmable interconnections, network-on-chip (NOC) routing interconnections, fixed interconnections, etc.

Logic analyzer circuits 104 and 124 can capture signals generated by circuits in blocks 106 (or other blocks in IC 100) and transmit these captured signals to a host computer system 114 via channels 116 and 136, respectively. Logic analyzer circuits 104 and 124 can capture signals originating from any source circuit within any of the blocks 106 shown in FIG. 1, including signals originating from logic circuits in smaller blocks within blocks 106. The signals captured by one or both of logic analyzer circuits 104 and 124 are also referred to herein as monitored signals.

Logic analyzer circuits 104 and 124 can capture signals from logic circuits in blocks 106, packetize these captured signals with source clock signal timing information, and transmit these captured signals to the host computer system 114 for storage and debugging (e.g., signal trace reconstruction by post processing software). Logic analyzer circuits 104 and 124 can be used to debug signal data packetization by monitoring debug signal byte lane values, create packets containing new data values and source clock timing information, and send these packets to host computer system 114 for storage and debugging.

Logic analyzer circuits 104 and 124 can support multiple modes of operation, including, for example, a continuous drain mode and a standalone buffer mode. In the continuous drain mode, logic analyzer circuits 104 and 124 can continuously attempt to drain data from the signals captured from blocks 106 downstream to a central trace aggregator (e.g., in IC 100 or host computer system 114) when the downstream tracing path is available. If there is no intent to drain the data downstream, then a standalone buffer in one or both of logic analyzer circuits 104 and/or 124 can operate in two modes that include stop-on-full mode and circular buffer mode. Logic analyzer circuits 104 and 124 can support standalone buffer mode with configurable start and stop signal trace storage, including a manual method using configurable status registers and a hardware trigger.

Logic analyzer circuits 104 and 124 can also provide a watermarking ability to indicate to the host computer system 114 when storage of the signals captured from blocks 106 has reached a programmable threshold. Logic analyzer circuits 104 and 124 can also store individual byte lanes in separate output streams or can combine multiple byte lanes into a single output stream. In some implementations, logic analyzer circuits 104 and 124 can, for example, only store new data values per bit masking for store-on-change data compression, which reduces the occurrence of new data values to store by the packetization logic in the logic analyzer circuits. Logic analyzer circuits 104 and 124 can also have byte wide event recognizers that use Boolean Logic Blocks (BLB) to further qualify data storage (e.g., based on logic states) and to drive trigger sequencer event inputs for the signals captured from blocks 106.

Logic analyzer circuits 104 and 124 can also source intellectual property (IP) clock counter circuits per each packet stream of the signals captured from blocks 106 to be used for detecting source IP clock gating and frequency changes. One or both of logic analyzer circuits 104 and 124 can include a Timestamp Counter Unit (TSCU) for combining an Always Running Timer (ART) with a local fast counter to produce a timestamp. The TSCU in one or both of logic analyzer circuits 104 and 124 can generate timestamps that indicate times at which signals captured from logic circuits in blocks 106 are received. One or both of logic analyzer circuits 104 and 124 can transmit the timestamps to the host computer system 114. One or both of logic analyzer circuits 104 and 124 can generate additional trigger packets that mark trigger locations in signal trace streams from blocks 106 when one or more externally driven trigger input signals are asserted. These trigger packets can also be transmitted to host computer system 114.

In embodiments in which IC 100 is a programmable IC, the blocks 106 can include programmable logic circuits (e.g., soft logic such as adaptive logic modules, lookup tables, programmable logic array blocks, etc.), DSP blocks, microprocessor circuits including hard or soft logic, hard IP blocks, input/output interfaces (e.g., serializer/de-serializer circuits), and/or memory blocks. Logic analyzer circuits 104 and 124 can capture signals generated by circuits in any of the programmable logic circuits (such as adaptive logic modules, lookup tables, programmable logic array blocks), DSP blocks, microprocessor circuits, hard IP blocks, input/output interfaces (e.g., serializer/de-serializer circuits), network-on-chip (NOC) routing, and/or memory blocks (e.g., SRAM) in IC 100. The signals can be transmitted from these circuits and blocks to logic analyzer circuits 104 and 124 through routing channels 108-112 and 132. Routing channels 108-112 and 132 can include programmable routing interconnections and conductors that can be programmed as disclosed below.

The logic analyzer circuits 104 and 124 can be implemented with non-programmable logic circuits (i.e., hard logic). By implementing the logic analyzer circuits 104 and 124 with hard logic in a programmable IC 100, a user can debug a circuit design for programmable IC 100, without negatively impacting or changing the utilization of soft logic resources in the IC 100 by the circuit design. As a result, the user can maximize the utilization of the soft logic in blocks 106 by the circuit design. Implementing the logic analyzer circuit 104 in hard logic avoids compile and fitting iterations of the circuit design to the programmable IC 100 and drastically reduces turnaround time for user debugging cycles of the circuit design. Because debug logic circuits are not added to the soft logic in blocks 106 to perform signal capture or debugging of the circuit design, signals generated by the circuit design can be captured by the logic analyzer circuits 104 and 124, without changing the timing or states of the circuit design. As a result, the user can debug scenarios in the circuit design that are sensitive to changes in the erroneous system behavior. Additional external terminals and soft logic resources of IC 100 are not needed to enable user logic debugging functions using signals captured by the logic analyzer circuits 104 and 124.

Horizontal routing channel 108 is coupled to the logic analyzer circuit 104 through a bi-directional routing channel 112. Horizontal routing channel 108 is coupled to the logic analyzer circuit 124 through a bi-directional routing channel 136. Horizontal routing channel 108 is also coupled to each of the vertical routing channels 109, 110, and 111. Each of the routing channels 108-111 can be coupled to logic circuits in adjacent blocks 106 through local routing channels that include conductors/wires for routing signals and interconnections. Routing channels 108-112 can be programmed to route signals from any one or more of the logic circuits in any one or more of the blocks 106 to the logic analyzer circuits 104 and/or 124 (e.g., during a test mode or during normal system operation). Also, routing channels 108-112 can be programmed route signals from the logic analyzer circuits 104 and/or 124 to any one or more of the logic circuits in any one or more of the blocks 106. A software program (e.g., run on host computer system 114) can implement an algorithm that couples selected debug nodes in the blocks 106 through the routing channels 108-112 to an interface that is coupled to the logic analyzer circuits 104 and/or 124.

Embedding logic analyzer circuits 104 and 124 in IC 100 allows signals to be captured by the logic analyzer circuits 104 and 124 both before and after one or more trigger conditions. The signals can include, for example, an acquisition clock signal, data input signals, trigger conditions for source inputs, and storage qualifier conditions for source inputs. The logic analyzer circuits 104 and 124 capture and store logic signals (e.g., from the logic circuits in blocks 106), and unload these logic signals for viewing on host computer system 114. Using an electronic design automation (EDA) software tool running on the host computer system 114, a user can specify, for example, signals of the IC 100 to be monitored, one or more trigger conditions, a total number of samples of the signals to be stored, a number of samples of the signals to be captured after the trigger condition(s) occur, and a system clock signal. Signals are stored continuously in memory in the logic analyzer circuits 104 and 124. Once the trigger condition(s) occur, more samples of the signals are captured, if desired, in addition to those signals captured before the trigger condition(s) occur. The EDA tool directs the logic analyzer circuits 104 and 124 to unload the data from memory for display on the host computer system 114. The trigger condition(s) and the number of samples can be changed without recompiling the IC or the host. The logic analyzer circuits 104 and 124 can be controlled via one or more external terminals of the IC (e.g., JTAG ports). Input and output signals of the logic analyzer circuits 104 and 124 are routed through the one or more external terminals to and from the host computer system 114 using input and output buffer circuits in the IC 100.

Figure 2:
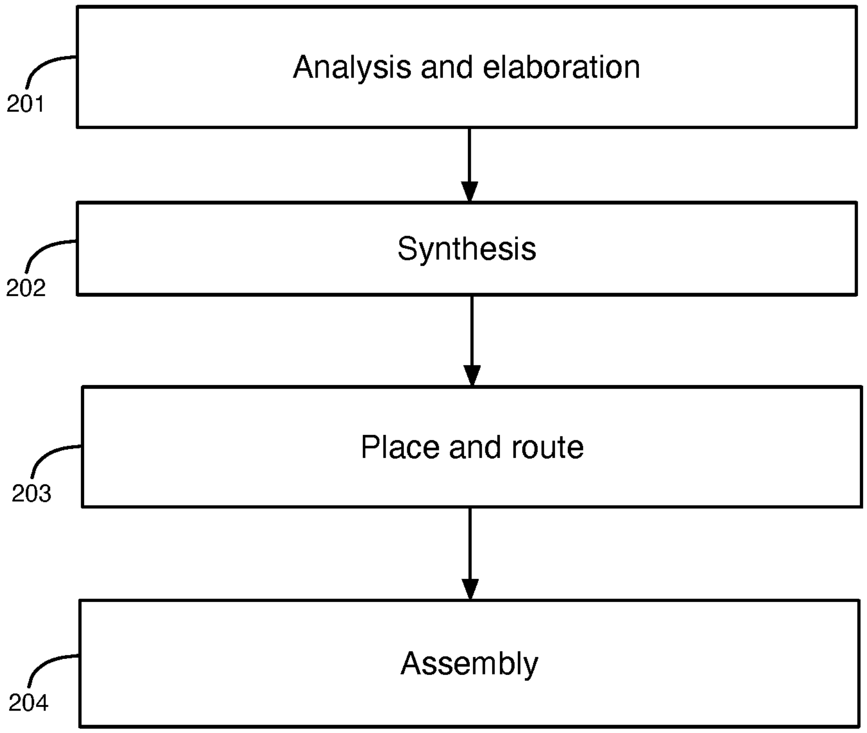
FIG. 2 is a flow chart that illustrates examples of compilation operations of a circuit design for a programmable integrated circuit (IC).

In embodiments in which IC 100 is a programmable IC, the routings between monitored internal nodes generating signals in IC 100 (e.g., in blocks 106) and the logic analyzer circuits 104 and 124 can be made at various stages throughout the compilation of a circuit design for programmable IC 100. A user can decide which stage of compilation of the circuit design to route signals to the logic analyzer circuits 104 and 124. FIG. 2 is a flow chart that illustrates examples of compilation operations of a circuit design for a programmable IC. After a circuit design for a programmable IC has been entered by a circuit designer using EDA tools and a register transfer level (RTL) file for the circuit design has been generated, analysis and elaboration can be performed in operation 201 using the RTL file to simulate the functionality of the circuit design. The analysis and elaboration performed in operation 201 can include timing analysis of the circuit design using timing constraints. If the functionality of the circuit design is incomplete or incorrect, the circuit designer can make changes to the circuit design using the EDA tools and generate a new RTL file.

The circuit designer can, for example, create routings (i.e., couplings) between selected internal nodes generating signals to be monitored and captured in IC 100 and logic analyzer circuits 104 and 124 during or after analysis and elaboration operation 201 and before synthesis. Advantages of creating these routings during or after operation 201 and before synthesis include providing maximum signal visibility and providing signal names that are close to the signal names used in the RTL file. Disadvantages of creating these routings during or after operation 201 include requiring full compilation of the circuit design and possible changes to the timing of the circuit design.

After the functional operation of the circuit design has been determined to be satisfactory, logic synthesis and optimization tools (e.g., part of the EDA tools) can generate a gate-level netlist of the circuit design during synthesis operation 202. The logic synthesis and optimization tools can optimize the circuit design by making appropriate selections of hardware to implement different logic functions in the circuit design based on circuit design data and constraint data entered by the circuit designer using EDA tools.

The circuit designer can, for example, create routings (i.e., couplings) between selected internal nodes generating signals to be monitored and captured in IC 100 and logic analyzer circuits 104 and 124 before, during, or after synthesis operation 202. Advantages of creating these routings during or after synthesis operation 202 include providing the ability to observe states of the gate-level netlist generated during synthesis operation 202, reducing the analysis and elaboration performed in operation 201, and possibly reducing the time to perform synthesis operation 202. Disadvantages of creating these routings during or after synthesis operation 202 include providing a limited number of signal names that match the signal names used in the RTL file and causing changes to the timing of the circuit design.

After synthesis operation 202, the circuit designer can use placement and routing tools (e.g., that are part of the EDA tools) to perform place and route operations 203. The placement and routing tools can be used to determine where to place each gate of the gate-level netlist produced during operation 202 within the programmable IC. The place and route operations 203 create orderly and efficient implementations of circuit designs for any targeted integrated circuit (e.g., for a given programmable integrated circuit such as a field-programmable gate array (FPGA)).

The circuit designer can, for example, create routings (i.e., couplings) between selected internal nodes generating signals to be monitored and captured in IC 100 and logic analyzer circuits 104 and 124 during or after place and route operations 203. Advantages of creating these routings during or after place and route operations 203 include providing the ability to observe states of the post-compilation circuit design generated during place and route operations 203, preserving the timing of the circuit design, and reducing the compilation time. Disadvantages of creating these routings during or after place and route operations 203 include providing a limited number of signal names that match the signal names used in the RTL file.

In operation 204, the EDA tools perform assembly of the placed and routed circuit design generated in operations 203 to generate a full or partial device configuration file. The configuration file can include, for example, a mask-level layout description of the integrated circuit or configuration data for programming the programmable IC.

The EDA tools can provide a user interface that allows the circuit designer to make decisions regarding where in the design flow of FIG. 2 to create the routings between nodes (generating to signals to be monitored and captured) and the logic analyzer circuits 104 and 124. The user interface can include project setting files, automation scripting, and a graphical user interface. By using the user interface, the circuit designer can choose the signal names based on the compilation stage (e.g., one or more of operations 201-203). The circuit designer can define the couplings between the nodes generating signals to be monitored and captured and the input ports of the logic analyzer circuits 104 and 124. In some embodiments, the couplings between the nodes generating signals to be monitored and captured and the input ports of the logic analyzer circuits 104 and 124 can be made during partial reconfiguration of a programmable logic IC.

The logic analyzer circuits 104 and 124 each have a signal input interface that is latency insensitive. The EDA tools can add an equal number of registers along each signal path from the signal source (i.e., a node) to the signal input interface to each of the logic analyzer circuits 104 and 124. The registers are added to meet the timing requirements based on the clock signal input to the logic analyzer circuits 104 and 124. The number of registers added to each signal path is selected based on the timing requirements for the signal path. The EDA tools can provide a user interface to allow the circuit designer to specify how the latency difference is tolerated. Based on input from the circuit designer, the EDA tools can insert the necessary number of registers into the signal paths that are not equal among all signal paths to the logic analyzer circuits 104 and 124. The EDA tools operating on the host computer system 114 can include a logic analyzer control and analysis tool that applies the one or more trigger conditions and visualizes the captured data based on the latency difference among the signal paths.

If IC 100 is a programmable IC, IC 100 can be fully or partially configured to couple the logic analyzer circuits 104 and 124 to the nodes being monitored in the circuit design. If the system under debug needs to restart, full configuration of IC 100 is used to configure the programmable IC with an image of the circuit design, including the couplings to the logic analyzer circuits 104 and 124. If the system under debug needs to maintain the current system state, partial device configuration can be used to configure the programmable IC only with the couplings to the logic analyzer circuits 104 and 124. In some implementations, the logic analyzer circuits 104 and 124 can capture signals from monitored nodes in circuits in blocks 106 during the configuration or partial reconfiguration of the programmable IC 100.

The host computer system 114 can run a logic analyzer tool that the circuit designer can use to configure trigger conditions and storage conditions for the logic analyzer circuits 104 and 124 to access and store signals from the monitored nodes and/or circuits in the blocks 106. The logic analyzer tool can also be configured to display the captured signal data in various user interfaces, such as waveforms, lists, and decoded information. The logic analyzer tool typically exchanges data with the logic analyzer circuits 104 and 124 via an on-chip debug communication channel and/or an additional probe hardware/cable (collectively represented as 116 and 136 in FIG. 1).

In some implementations, the input interfaces to the logic analyzer circuits 104 and 124 through channels 112 and 132, respectively, may have a limited width that does not allow all of the signals that are being monitored in IC 100 to be transmitted to the logic analyzer circuits 104 and 124 concurrently. In these implementations, the input interfaces to the logic analyzer circuits 104 and 124 can include one or more multiplexer circuits that can be configured and reconfigured to provide the states of different groups of the monitored signals from the blocks 106 to the logic analyzer circuits 104 and 124 at different times. The multiplexer circuits allow the logic analyzer circuits 104 and 124 to acquire the states of many more signals than the input interfaces can transmit to the logic analyzer circuits 104 and 124 at any one time.

Figure 3:
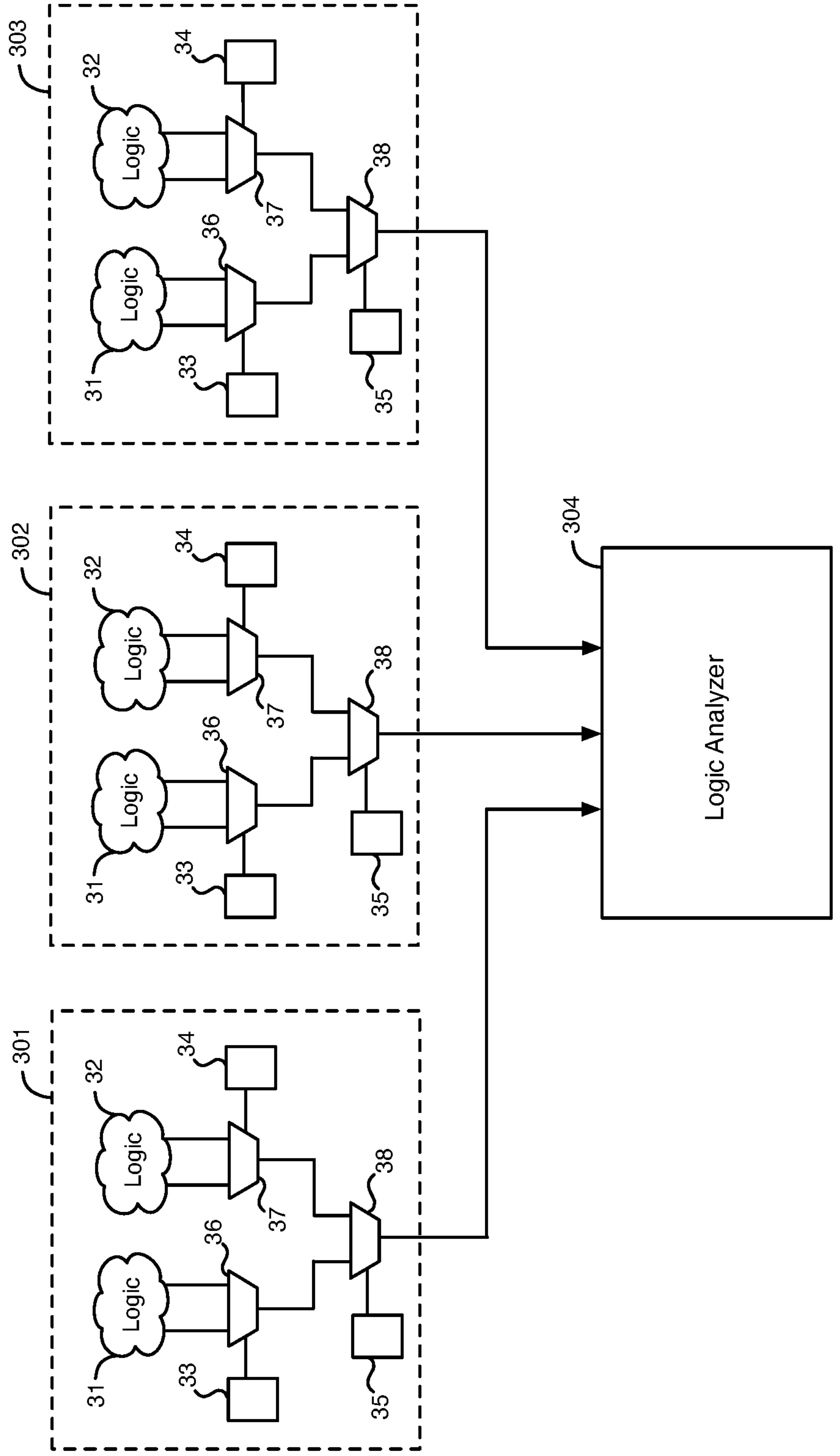
FIG. 3 is a diagram illustrating an example of an input interface to a logic analyzer circuit that includes multiplexer circuits controlled by register circuits.

FIG. 3 is a diagram illustrating an example of an input interface to a logic analyzer circuit 304 that includes multiplexer circuits controlled by register circuits. The logic analyzer circuit 304 of FIG. 3 can be, for example, either of the logic analyzer circuits 104 or 124 of FIG. 1. The input interface of FIG. 3 includes three parallel selection circuits 301, 302, and 303 that are located in IC 100 (e.g., in blocks 106). Three selection circuits 301-303 are shown in FIG. 3 merely as an example. It should be understood that the input interface to logic analyzer circuit 304 can have any number of selection circuits that have the circuitry of selections circuits 301-303.

Each of the selection circuits 301-303 includes logic circuits 31 and 32 (e.g., user logic circuits in a programmable IC), three register circuits 33-35, and three multiplexer circuits 36-38. In a programmable IC, the logic circuits 31-32 include programmable logic circuits, such as adaptive logic modules, programmable logic array blocks, lookup tables, etc. In some implementations of a programmable logic IC, the multiplexers 36-38 in each of the selection circuits 301-303 can be implemented by combinatorial programmable logic circuits, such as look-up table (LUT) circuits, in blocks 106 (e.g., programmable logic blocks).

The following description of circuits 31-38 applies to each of the selection circuits 301-303. Logic circuits 31 provide two output logic signals to data inputs of multiplexer circuit 36, and logic circuits 32 provide two output logic signals to data inputs of multiplexer circuit 37. The output logic signals of logic circuits 31-32 provided to multiplexer circuits 36-37 are signals that can be monitored and stored in the logic analyzer circuit 304 for the purpose of debugging the circuit design for IC 100. The selected output signals of multiplexer circuits 36-37 are provided to data inputs of multiplexer circuit 38.

Outputs of the register circuits 33-34 are coupled to select inputs of multiplexer circuits 36-37, respectively. The values of the output signals stored in register circuits 33-34 control the selection of the multiplexer circuits 36-37, respectively. That is, the values of the output signals stored in register circuits 33-34 determine which of the output logic signals of the logic circuits 31-32 are provided through multiplexer circuits 36-37 to data inputs of multiplexer circuit 38.

The value of the output signal stored in register circuit 35 controls the selection of multiplexer circuit 38. That is, the value of the output signal stored in register circuit 35 determines which of the output signals of the multiplexer circuits 36-37 is provided through multiplexer circuit 38 to an input of logic analyzer circuit 304.

Logic analyzer circuit 304 receives the value of a monitored signal from logic circuits 31 or 32 in each of the selection circuits 301-303. Thus, logic analyzer circuit 304 receives the values of three monitored signals from the three selection circuits 301-303 at any one time. The values of one or more of the output signals stored in one or more of the register circuits 33-35 in any of the selection circuits 301-303 can be changed at any time to reconfigure the multiplexer circuits 36-38 in that selection circuit to provide the value of a different logic signal from one of logic circuits 31-32 to logic analyzer circuit 304. The values of the output signals stored in the register circuits 33-35 can be changed, for example, by the logic analyzer tool in the host computer system 114.

Thus, selection circuits 301-303 can be reconfigured at any time by changing the selection of one or more of the multiplexer circuits 36-38 to provide the values of a different set of monitored signals from logic circuits 31-32 to logic analyzer circuit 304. As a result, selection circuits 301-303 can be configured and reconfigured to select a much larger number of monitored signals that are provided in groups to logic analyzer circuit 304 at different times. The monitored signals are selected in groups, and each group of the monitored signals is transmitted to logic analyzer circuit 304 at a different time. For example, a first group of the monitored signals can be transmitted by selection circuits 301-303 to logic analyzer circuit 304 in a first time interval, and a second group of the monitored signals can be transmitted by selection circuits 301-303 to the logic analyzer circuit 304 in a second time interval after the first time interval. Each group of signals can, for example, include hundreds or thousands of monitored signals, if IC 100 has enough of the selection circuits 301-303.

Figure 4:
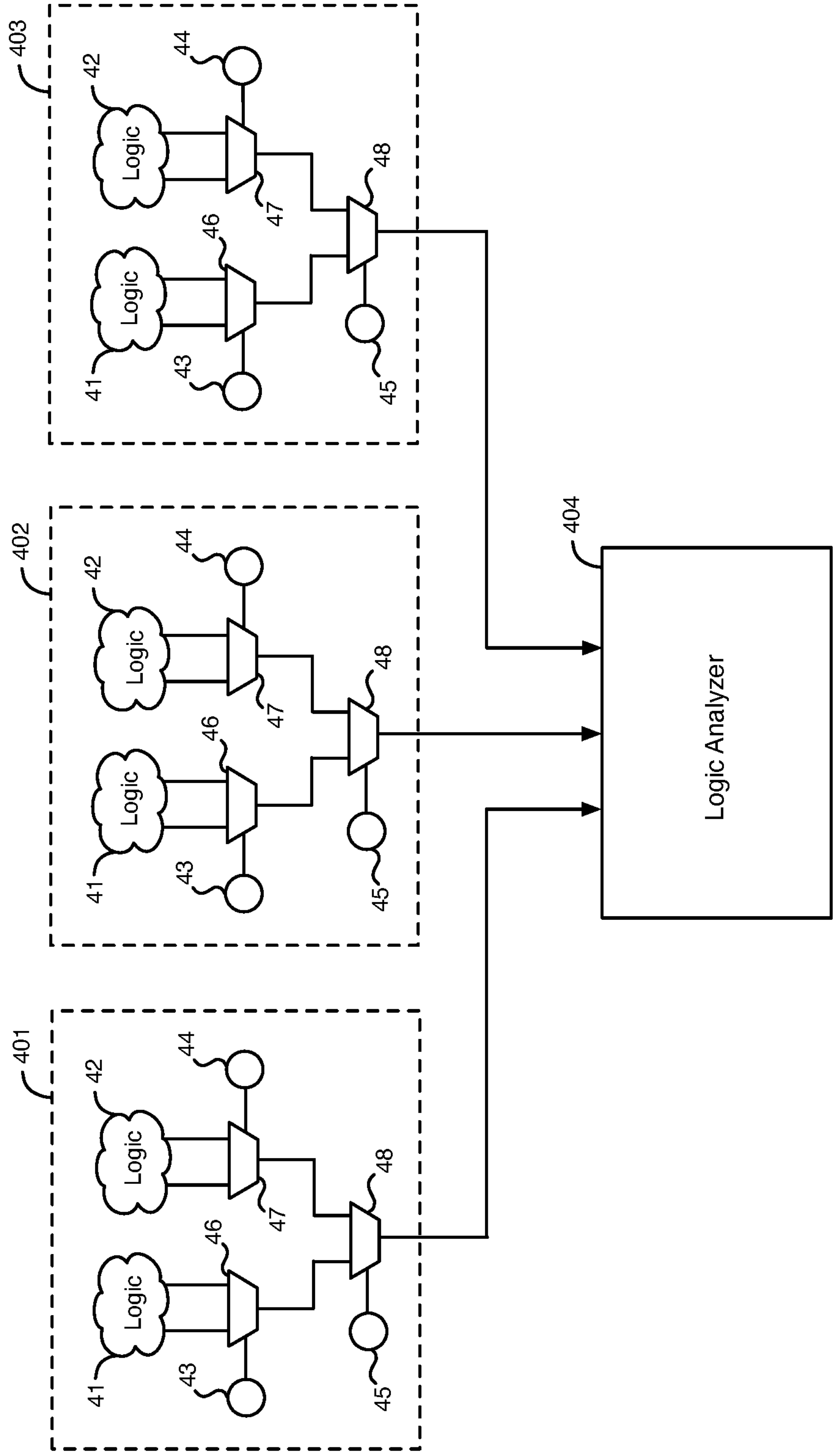
FIG. 4 is a diagram illustrating an example of an input interface to a logic analyzer circuit that includes multiplexer circuits controlled by configuration memory circuits.

FIG. 4 is a diagram illustrating an example of an input interface to a logic analyzer circuit 404 that includes multiplexer circuits controlled by memory circuits. The logic analyzer circuit 404 of FIG. 4 can be, for example, either of the logic analyzer circuits 104 or 124 of FIG. 1. The input interface of FIG. 4 includes three parallel selection circuits 401, 402, and 403 that are located in IC 100. In embodiments in which IC 100 is a programmable IC, selection circuits 401, 402, and 403 can include multiplexers that are, for example, in programmable routing channels, such as routing channels 108-112 and/or 132. Three selection circuits 401-403 are shown in FIG. 4 merely as an example. It should be understood that the input interface to logic analyzer circuit 404 can have any number of selection circuits that have the circuitry of selections circuits 401-403 and/or 301-303.

Each of the selection circuits 401-403 includes logic circuits 41 and 42 (e.g., user logic circuits in a programmable IC), three memory circuits 43-45, and three multiplexer circuits 46-48. In a programmable IC, the logic circuits 41-42 include programmable logic circuits, such as adaptive logic modules, lookup tables, or programmable logic array blocks, the memory circuits 43-45 are configuration memory circuits (e.g., configurable random access memory (RAM)) that store configuration data for configuring IC 100, and the multiplexer circuits 46-48 are in the programmable routing channels in the routing fabric, such as channels 108-112 and 132 in IC 100.

The following description of circuits 41-48 applies to each of the selection circuits 401-403. Logic circuits 41 provide two output logic signals to data inputs of multiplexer circuit 46, and logic circuits 42 provide two output logic signals to data inputs of multiplexer circuit 47. The output logic signals of logic circuits 41-42 provided to multiplexer circuits 46-47 are signals that can be monitored and stored in the logic analyzer circuit 404 for the purpose of debugging the circuit design for IC 100. The output signals of multiplexer circuits 46-47 are provided to data inputs of multiplexer circuit 48.

Outputs of the memory circuits 43-44 are coupled to select inputs of multiplexer circuits 46-47, respectively. The values of the signals stored in memory circuits 43-44 control the selection of the multiplexer circuits 46-47, respectively. That is, the values of the signals stored in memory circuits 43-44 determine which of the output logic signals of the logic circuits 41-42 are provided through multiplexer circuits 46-47 to data inputs of multiplexer circuit 48.

The value of the signal stored in memory circuit 45 controls the selection of multiplexer circuit 48. That is, the value of the signal stored in memory circuit 45 determines which of the output signals of the multiplexer circuits 46-47 is provided through multiplexer circuit 48 to an input of logic analyzer circuit 404.

In the example of FIG. 4, the logic analyzer circuit 404 receives the value of a monitored signal from logic circuits 41 or 42 in each of the selection circuits 401-403. Thus, logic analyzer circuit 404 receives the values of three monitored signals from the three selection circuits 401-403 at any one time. The values of one or more of the signals stored in one or more of the memory circuits 43-45 in any of the selection circuits 401-403 can be changed at any time to reconfigure the multiplexer circuits 46-48 in that selection circuit to provide the value of a different signal from one of logic circuits 41-42 to logic analyzer circuit 404. The values of the signals stored in the memory circuits 43-45 can be configured at run-time using partial reconfiguration of a programmable IC, without affecting the states of the circuit design programmed into the programmable IC.

Thus, selection circuits 401-403 can be reconfigured at any time (e.g., using partial reconfiguration) by changing the selection of one or more of the multiplexer circuits 46-48 to provide the values of a different set of monitored signals from logic circuits 41-42 to logic analyzer circuit 404. As a result, selection circuits 401-403 can be configured and reconfigured to select a much larger number of monitored signals that are provided in groups to logic analyzer circuit 404 at different times. The monitored signals are selected in groups, and each group of the monitored signals is transmitted to logic analyzer circuit 404 at a different time. For example, a first group of the monitored signals can be transmitted by selection circuits 401-403 to logic analyzer circuit 404 in a first time interval, and a second group of the monitored signals can be transmitted by selection circuits 401-403 to the logic analyzer circuit 404 in a second time interval after the first time interval. Each group of signals can, for example, include hundreds or thousands of monitored signals, if IC 100 has enough of the selection circuits 401-403.

Figure 5:
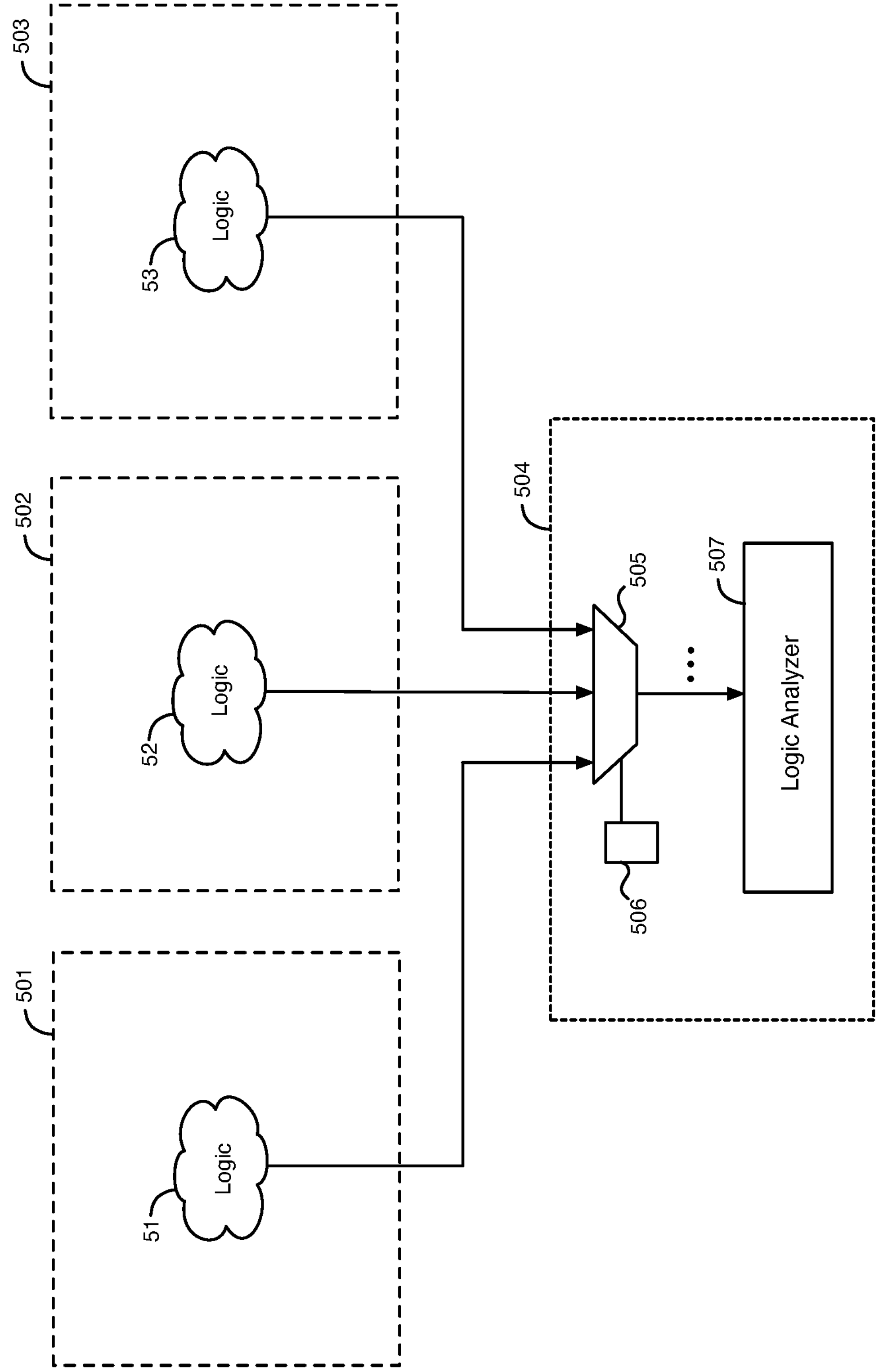
FIG. 5 is a diagram illustrating an example of an input interface to a logic analyzer circuit that includes a multiplexer circuit in the peripheral region of the IC.

FIG. 5 is a diagram illustrating an example of an input interface to a logic analyzer circuit 507 that includes a multiplexer circuit in the peripheral region of IC 100. The logic analyzer circuit 507 of FIG. 5 can be, for example, either of the logic analyzer circuits 104 or 124 of FIG. 1. FIG. 5 illustrates three regions 501, 502, and 503 (e.g., blocks 106) of IC 100 that include logic circuits 51, 52, and 53, respectively. Three logic circuits 51-53 are shown in FIG. 5 merely as an example. It should be understood that the logic analyzer circuit 507 can receive signals from any number of logic circuits. In a programmable IC, the logic circuits 51-53 include programmable logic circuits, such as adaptive logic modules, lookup tables, programmable logic array blocks, etc.

Circuitry 504 located in the peripheral region of the IC 100 includes a multiplexer circuit 505, a register circuit 506, and the logic analyzer circuit 507. An output logic signal of each of the logic circuits 51, 52, and 53 is provided to a different data input of the multiplexer circuit 505. Thus, multiplexer circuit 505 receives at least three signals from at least three different logic circuits 51-53 at three or more data inputs.

Register circuit 506 stores output signals that are provided to the select inputs of multiplexer circuit 505. The values of the output signals stored in register circuit 506 control the selection of multiplexer circuit 505. That is, the values of the output signals stored in register circuit 506 determine which of the signals received from logic circuits 51-53 is provided to an input of logic analyzer circuit 507. In some implementations, multiplexer circuit 505 can be configured to provide two or more signals from logic circuits 51-53 (and possibly other logic circuits) to logic analyzer circuit 507 concurrently.

The values of the output signals stored in register circuit 506 can be changed using tools by latching different values into register circuit 506 via the debug communication channels, such as Joint Test Action Group (JTAG) channels, etc. The values of the output signals stored in register circuit 506 can be changed at any time to change the selection of multiplexer circuit 505 to provide the value of a different monitored signal (or the values of multiple different monitored signals) from logic circuits 51-53 to logic analyzer circuit 507. As a result, multiplexer circuit 505 can be configured and reconfigured to select a much larger number of monitored signals that are provided to logic analyzer circuit 507 at different times. Each monitored signal or group of monitored signals is selected by multiplexer circuit 505 and transmitted to logic analyzer circuit 507 at a different time. Each group of signals can, for example, include hundreds or thousands of monitored signals, if multiplexer circuit 505 has enough inputs that are coupled to as many logic circuits.

In some implementations, two or more of the input interfaces disclosed herein with respect to FIGS. 3-5 can be used in an IC in a single channel that provides monitored signals to the logic analyzer circuits 104 and 124. Any combination of the input interfaces disclosed herein with respect to FIGS. 3-5 can be deployed in a single IC to achieve a desired user signal selection and grouping of signals (e.g., signal width) to be monitored using logic analyzer circuits 104 and 124. In other implementations, any one or more of the input interfaces disclosed herein with respect to FIGS. 3-5 can be used to provide monitored signals to a logic analyzer circuit implemented in soft logic in a programmable IC.

Figure 6:
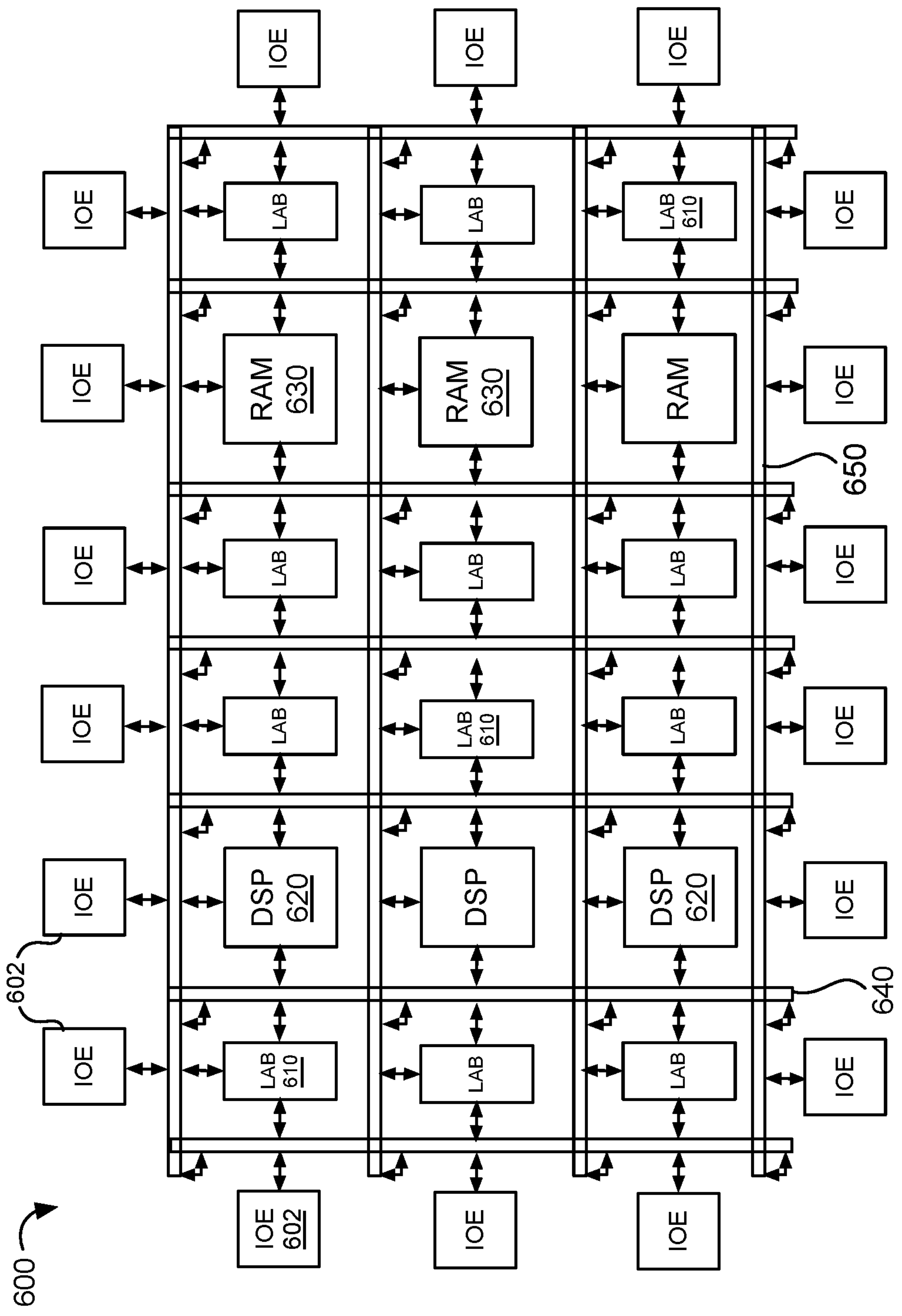
FIG. 6 illustrates an example of a programmable integrated circuit (IC) that can include circuits disclosed herein.

FIG. 6 illustrates an example of a programmable integrated circuit (IC) 600 that can include circuits disclosed herein. For example, the programmable IC 600 can be IC 100 disclosed herein with respect to FIG. 1. As shown in FIG. 6, the programmable integrated circuit (IC) 600 includes a two-dimensional array of configurable (programmable) functional circuit blocks, including configurable logic array blocks (LABs) 610 and other functional circuit blocks, such as random access memory (RAM) blocks 630 and digital signal processing (DSP) blocks 620. Functional blocks such as LABs 610 can include smaller programmable logic circuits (e.g., logic elements, logic blocks, or adaptive logic modules) that receive input signals and perform custom functions on the input signals to produce output signals. In some implementations, LABs 610 can be, or include, the logic circuits of FIGS. 3-5. The configurable function circuit blocks shown in FIG. 6 can be organized into sectors or can each include multiple sectors of programmable logic circuits.

In addition, programmable IC 600 can have input/output elements (IOEs) 602 for driving signals off of programmable IC 600 and for receiving signals from other devices. Input/output elements 602 can include parallel input/output circuitry, serial data transceiver circuitry, differential receiver and transmitter circuitry, or other circuitry used to connect one integrated circuit to another integrated circuit. As shown, input/output elements 602 can be located around the periphery of the chip. If desired, the programmable IC 600 can have input/output elements 602 arranged in different ways. For example, input/output elements 602 can form one or more columns, rows, or islands of input/output elements that may be located anywhere on the programmable IC 600.

The programmable IC 600 can also include programmable interconnect circuitry in the form of vertical routing channels 640 (i.e., interconnects formed along a vertical axis of programmable IC 600) and horizontal routing channels 650 (i.e., interconnects formed along a horizontal axis of programmable IC 600), each routing channel including at least one conductor to route at least one signal.

Note that other routing topologies, besides the topology of the interconnect circuitry depicted in FIG. 6, may be used. For example, the routing topology can include wires that travel diagonally or that travel horizontally and vertically along different parts of their extent as well as wires that are perpendicular to the device plane in the case of three dimensional integrated circuits. The driver of a wire can be located at a different point than one end of a wire.

Furthermore, it should be understood that embodiments disclosed herein with respect to FIGS. 1-5 can be implemented in any integrated circuit or electronic system. If desired, the functional blocks of such an integrated circuit can be arranged in more levels or layers in which multiple functional blocks are interconnected to form still larger blocks. Other device arrangements can use functional blocks that are not arranged in rows and columns.

Programmable IC 600 can contain programmable memory elements. Memory elements can be loaded with configuration data using input/output elements (IOEs) 602. Once loaded, the memory elements each provide a corresponding static control signal that controls the operation of an associated configurable functional block (e.g., LABs 610, DSP blocks 620, RAM blocks 630, or input/output elements 602).

In a typical scenario, the outputs of the loaded memory elements are applied to the gates of metal-oxide-semiconductor field-effect transistors (MOSFETs) in a functional block to turn certain transistors on or off and thereby configure the logic in the functional block including the routing paths. Programmable logic circuit elements that can be controlled in this way include multiplexers (e.g., multiplexers used for forming routing paths in interconnect circuits), look-up tables, logic arrays, AND, OR, XOR, NAND, and NOR logic gates, pass gates, etc.

The programmable memory elements can be organized in a configuration memory array having rows and columns. A data register that spans across all columns and an address register that spans across all rows can receive configuration data. The configuration data can be shifted onto the data register. When the appropriate address register is asserted, the data register writes the configuration data to the configuration memory bits of the row that was designated by the address register.

In certain embodiments, programmable IC 600 can include configuration memory that is organized in sectors, whereby a sector can include the configuration RAM bits that specify the functions and/or interconnections of the subcomponents and wires in or crossing that sector. Each sector can include separate data and address registers.

The programmable IC of FIG. 6 is merely one example of an IC that can be used with embodiments disclosed herein. The embodiments disclosed herein can be used with any suitable integrated circuit or system. For example, the embodiments disclosed herein can be used with numerous types of devices such as processor integrated circuits, central processing units, memory integrated circuits, graphics processing unit integrated circuits, application specific standard products (ASSPs), application specific integrated circuits (ASICs), and programmable logic integrated circuits. Examples of programmable logic integrated circuits include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits disclosed in one or more embodiments herein can be part of a data processing system that includes one or more of the following components: a processor; memory; input/output circuitry; and peripheral devices. The data processing system can be used in a wide variety of applications, such as computer networking, data networking, instrumentation, video processing, digital signal processing, or any suitable other application. The integrated circuits can be used to perform a variety of different logic functions.

In general, software and data for performing any of the functions disclosed herein can be stored in non-transitory computer readable storage media. Non-transitory computer readable storage media is tangible computer readable storage media that stores data and software for access at a later time, as opposed to media that only transmits propagating electrical signals (e.g., wires). The software code may sometimes be referred to as software, data, program instructions, instructions, or code. The non-transitory computer readable storage media can, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now disclosed. Example 1 is an integrated circuit comprising: logic circuits; a logic analyzer circuit; and a first multiplexer circuit configurable to provide a value of a first signal selected from a first one of the logic circuits to the logic analyzer circuit, wherein the logic analyzer circuit is configured to store the value of the first signal selected by the first multiplexer circuit.

In Example 2, the integrated circuit of Example 1 may optionally include, wherein the logic analyzer circuit is implemented in hard logic, and the integrated circuit is a programmable integrated circuit.

In Example 3, the integrated circuit of any one of Examples 1-2 may optionally include, wherein the logic analyzer circuit is configured to provide the value of the first signal from the first one of the logic circuits outside the integrated circuit.

In Example 4, the integrated circuit of any one of Examples 1-3 may optionally include, wherein the first multiplexer circuit is reconfigurable to provide a value of a second signal selected from a second one of the logic circuits to the logic analyzer circuit, and the logic analyzer circuit is configured to store the value of the second signal.

In Example 5, the integrated circuit of any one of Examples 1~4 further comprises: a second multiplexer circuit configurable to select a value of a second signal from a second one of the logic circuits; and a third multiplexer circuit configurable to provide a value of a selected one of the first signal selected by the first multiplexer circuit or the second signal selected by the second multiplexer circuit to the logic analyzer circuit.

In Example 6, the integrated circuit of any one of Examples 1-5 may optionally include, wherein the logic analyzer circuit is configured to generate trigger packets that mark trigger locations in signal trace streams from the logic circuits in response to trigger input signals.

In Example 7, the integrated circuit of any one of Examples 1-6 may optionally include, wherein the first multiplexer circuit is in one of a lookup table circuit, a routing channel of the integrated circuit configurable to route signals from the logic circuits, or a peripheral region of the integrated circuit.

In Example 8, the integrated circuit of any one of Examples 1-6 may optionally include, wherein the logic analyzer circuit is configured to generate a timestamp that indicates a time at which the value of the first signal is received at the logic analyzer circuit.

In Example 9, the integrated circuit of any one of Examples 1-8 may optionally include, wherein the logic analyzer circuit supports a continuous drain mode and a standalone buffer mode.

Example 10 is a method for capturing signals within an integrated circuit, the method comprising: providing a first logic signal from a first logic circuit to a first multiplexer circuit; providing a second logic signal from a second logic circuit to the first multiplexer circuit; selecting one of the first logic signal or the second logic signal as a first selected signal using the first multiplexer circuit, wherein the first and the second logic circuits and the first multiplexer circuit are in the integrated circuit; and storing a value of the first selected signal in a logic analyzer circuit in the integrated circuit.

In Example 11, the method of Example 10 may optionally include, wherein the first multiplexer circuit selects one of the first logic signal or the second logic signal as the first selected signal and the logic analyzer circuit stores the value of the first selected signal after analysis and elaboration of a circuit design for the integrated circuit.

In Example 12, the method of any one of Examples 10-11 may optionally include, wherein the first multiplexer circuit selects one of the first logic signal or the second logic signal as the first selected signal and the logic analyzer circuit stores the value of the first selected signal after synthesis of a circuit design to the integrated circuit.

In Example 13, the method of any one of Examples 10-12 may optionally include, wherein the first multiplexer circuit selects one of the first logic signal or the second logic signal as the first selected signal and the logic analyzer circuit stores the value of the first selected signal after placement and routing of a circuit design to the integrated circuit.

In Example 14, the method of any one of Examples 10-13 further comprises: providing a third logic signal from a third logic circuit to a second multiplexer circuit; providing a fourth logic signal from a fourth logic circuit to the second multiplexer circuit; and selecting one of the third logic signal or the fourth logic signal using the second multiplexer circuit as a second selected signal.

In Example 15, the method of Example 14 further comprises: selecting the first selected signal or the second selected signal as a third selected signal using a third multiplexer circuit; and storing a value of the third selected signal in the logic analyzer circuit.

In Example 16, the method of any one of Examples 10-15 may optionally include, wherein selecting one of the first logic signal or the second logic signal as the first selected signal using the first multiplexer circuit further comprises selecting the first logic signal as the first selected signal using the first multiplexer circuit during a first time interval, and selecting the second logic signal as the first selected signal using the first multiplexer circuit during a second time interval after the first time interval.

In Example 17, the method of any one of Examples 10-16 may optionally include, wherein storing the value of the first selected signal in the logic analyzer circuit further comprises storing the value of the first selected signal in the logic analyzer circuit in response to a trigger condition.

Example 18 is a programmable integrated circuit comprising: first and second logic circuits; a multiplexer circuit configurable to provide a value of an output signal of a selected one of the first or the second logic circuits in a selected signal; and a logic analyzer circuit configured to store the selected signal, wherein the logic analyzer circuit is implemented by hard logic.

In Example 19, the programmable integrated circuit of Example 18 may optionally include, wherein the multiplexer circuit is in a routing channel of the programmable integrated circuit that is configurable to route signals from the first and the second logic circuits.

In Example 20, the programmable integrated circuit of any one of Examples 18-19 may optionally include, wherein the logic analyzer circuit packetizes captured signals received from the first and the second logic circuits with source clock signal timing information for the captured signals.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising:

logic circuits;

a logic analyzer circuit; and a first multiplexer circuit configurable to provide a value of a first signal selected from a first one of the logic circuits to the logic analyzer circuit, wherein the logic analyzer circuit is configured to store the value of the first signal selected by the first multiplexer circuit, wherein the first multiplexer circuit is reconfigurable to provide a value of a second signal selected from a second one of the logic circuits to the logic analyzer circuit, and wherein the logic analyzer circuit is configured to store the value of the second signal selected by the first multiplexer circuit.

2. The integrated circuit of claim 1 further comprising:

routing channels coupled to the logic circuits, wherein the routing channels are programmable to route third signals from any of the logic circuits to the logic analyzer circuit, and wherein the routing channels are programmable to route fourth signals from the logic analyzer circuit to any of the logic circuits.

3. The integrated circuit of claim 1, wherein the logic analyzer circuit is configured to provide the value of the first signal from the first one of the logic circuits to a host computer system.

4. The integrated circuit of claim 1, wherein the logic circuits are in blocks that are arranged in rows and columns in the integrated circuit, and wherein the logic analyzer circuit is configured to capture third signals originating within any of the blocks of the logic circuits.

5. The integrated circuit of claim 1 further comprising:

a second multiplexer circuit configurable to select a value of a third signal from a third one of the logic circuits; and a third multiplexer circuit configurable to provide a value of a selected one of the first signal selected by the first multiplexer circuit, the second signal selected by the first multiplexer circuit, or the third signal selected by the second multiplexer circuit to the logic analyzer circuit.

6. The integrated circuit of claim 1, wherein the logic analyzer circuit is configured to generate trigger packets that mark trigger locations in signal trace streams from the logic circuits in response to trigger input signals.

7. The integrated circuit of claim 1, wherein the first multiplexer circuit is in one of a lookup table circuit, a routing channel of the integrated circuit configurable to route the first and the second signals from the logic circuits, or a peripheral region of the integrated circuit.

8. The integrated circuit of claim 1, wherein the logic analyzer circuit is configured to generate a timestamp that indicates a time at which the value of the first signal is received at the logic analyzer circuit.

9. The integrated circuit of claim 1, wherein the logic analyzer circuit supports a continuous drain mode and a standalone buffer mode.

10. A method for capturing signals within an integrated circuit, the method comprising:

providing a first logic signal from a first logic circuit to a first multiplexer circuit;

providing a second logic signal from a second logic circuit to the first multiplexer circuit;

selecting one of the first logic signal or the second logic signal as a first selected signal using the first multiplexer circuit, wherein the first and the second logic circuits and the first multiplexer circuit are in the integrated circuit; and storing a value of the first selected signal in a logic analyzer circuit in the integrated circuit.

11. The method of claim 10 further comprising:

creating routings between first and second internal nodes generating the first and the second logic signals and the logic analyzer circuit after analysis and elaboration of a circuit design for the integrated circuit.

12. The method of claim 10 further comprising:

creating routings between first and second internal nodes generating the first and the second logic signals and the logic analyzer circuit after synthesis of a circuit design for the integrated circuit.

13. The method of claim 10 further comprising:

creating routings between first and second internal nodes generating the first and the second logic signals and the logic analyzer circuit after placement and routing of a circuit design for the integrated circuit.

14. The method of claim 10 further comprising:

providing a third logic signal from a third logic circuit to a second multiplexer circuit;

providing a fourth logic signal from a fourth logic circuit to the second multiplexer circuit; and selecting one of the third logic signal or the fourth logic signal using the second multiplexer circuit as a second selected signal.

15. The method of claim 14 further comprising:

selecting the first selected signal or the second selected signal as a third selected signal using a third multiplexer circuit; and storing a value of the third selected signal in the logic analyzer circuit.

16. The method of claim 10, wherein selecting one of the first logic signal or the second logic signal as the first selected signal using the first multiplexer circuit further comprises selecting the first logic signal as the first selected signal using the first multiplexer circuit during a first time interval, and selecting the second logic signal as the first selected signal using the first multiplexer circuit during a second time interval after the first time interval.

17. The method of claim 10, wherein storing the value of the first selected signal in the logic analyzer circuit further comprises storing the value of the first selected signal in the logic analyzer circuit in response to a trigger condition.

18. A programmable integrated circuit comprising:

first and second logic circuits;

a multiplexer circuit configurable to provide a value of an output signal of a selected one of the first or the second logic circuits in a selected signal; and a logic analyzer circuit configured to store a value of the selected signal.

19. The programmable integrated circuit of claim 18, wherein the multiplexer circuit is in a routing channel of the programmable integrated circuit that is configurable to route signals from the first and the second logic circuits.

20. The programmable integrated circuit of claim 18, wherein the logic analyzer circuit packetizes captured signals received from the first and the second logic circuits with source clock signal timing information for the captured signals.

* * * * *